United States Patent [19]

Manz et al.

[11] Patent Number: 4,589,162
[45] Date of Patent: May 20, 1986

[54] CARRYING HANDLE DEVICE FOR AN ELECTRICAL EQUIPMENT ENCLOSURE WITH HANDLE STORED FLUSH WITH THE ENCLOSURE WALL AND SWUNG UP FOR CARRYING

[75] Inventors: Hermann Manz, Illingen; Walter Schweiger, Linkenheim, both of Fed. Rep. of Germany

[73] Assignee: Siemens Aktiengesellschaft, Munich and Berlin, Fed. Rep. of Germany

[21] Appl. No.: 651,981

[22] Filed: Sep. 19, 1984

[30] Foreign Application Priority Data

Sep. 19, 1983 [DE] Fed. Rep. of Germany ....... 3333826

[51] Int. Cl.[4] .............................................. B65D 25/28
[52] U.S. Cl. ......................................... 16/115; 16/126
[58] Field of Search ..................... 16/110 R, 112, 115, 16/123, 124, 125, 126, 332, 333, 343, 346, 347, DIG. 24, DIG. 40; 312/244

[56] References Cited

U.S. PATENT DOCUMENTS

| 3,020,075 | 2/1962 | Johnstone et al. | ............... 16/115 X |
| 3,744,084 | 7/1973 | Fankhouser | ...................... 16/115 X |
| 3,744,864 | 7/1973 | Schmitz | ....................... 16/115 X |

FOREIGN PATENT DOCUMENTS

| 18439 | 12/1979 | European Pat. Off. . |
| 44952 | 2/1982 | European Pat. Off. .......... 16/110 R |
| 72537 | 2/1983 | European Pat. Off. ............. 16/115 |

*Primary Examiner*—Fred Silverberg
*Attorney, Agent, or Firm*—F. W. Powers; J. L. James; J. R. Penrod

[57] ABSTRACT

A carrying device is provided for electrical apparatus enclosure. The carrying device has a handle which is attached to carrying arms which are bent in an approximate semi-circle. The arms are movably mounted behind the wall of enclosure for movement of the handle from a rest position to a working position. In the rest position the handle is flush in an opening of the enclosure and in working position, the handle is swung out upwards of the opening of the enclosure.

13 Claims, 4 Drawing Figures

CARRYING HANDLE DEVICE FOR AN ELECTRICAL EQUIPMENT ENCLOSURE WITH HANDLE STORED FLUSH WITH THE ENCLOSURE WALL AND SWUNG UP FOR CARRYING

The invention relates to a carrying device for electrical apparatus and more particularly to a storable, horizontal-running carrying handle with a perpendicularly attached bracket.

Generally, electrical equipment and apparatus have folding carrying handles attached to them. Electrical equipment having these folding handles often have the folding mechanism visible when the handle is folded and not in use. In addition, these handles often protrude from the surface of the equipment in an unsightly manner. Accordingly, it will be appreciated that it would be highly desirable to provide a carrying device which is functional, convenient to use, and aesthetically pleasing.

It is an object of this invention to provide carrying device for electrical equipment which is convenient to use and stores out of the way.

It is another object of this invention to provide a carrying devices which is not only easy to use and has an acceptable hardiness, but excels at the same time in not having an unsightly appearance.

SUMMARY OF THE INVENTION

Briefly stated, in accordance with one aspect of the invention the foregoing objects are achieved by providing a carrying handle device for an electrical apparatus enclosure. The device has elongate carrying arms bent in a semi-circular shape protruding through an opening in the wall of the enclosure and movably suspended behind the wall. A carrying handle is mounted on the arms and movable between rest and working positions. In the rest position the handle lies flush to the outside in the wall opening and in the working position is swung up, out of the housing. In the rest position the handle is conveniently stored out of the way preserving the appearance of the enclosure; yet, it is readily accessible when needed.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF A PREFERRED EMBODIMENT

Figure 1:
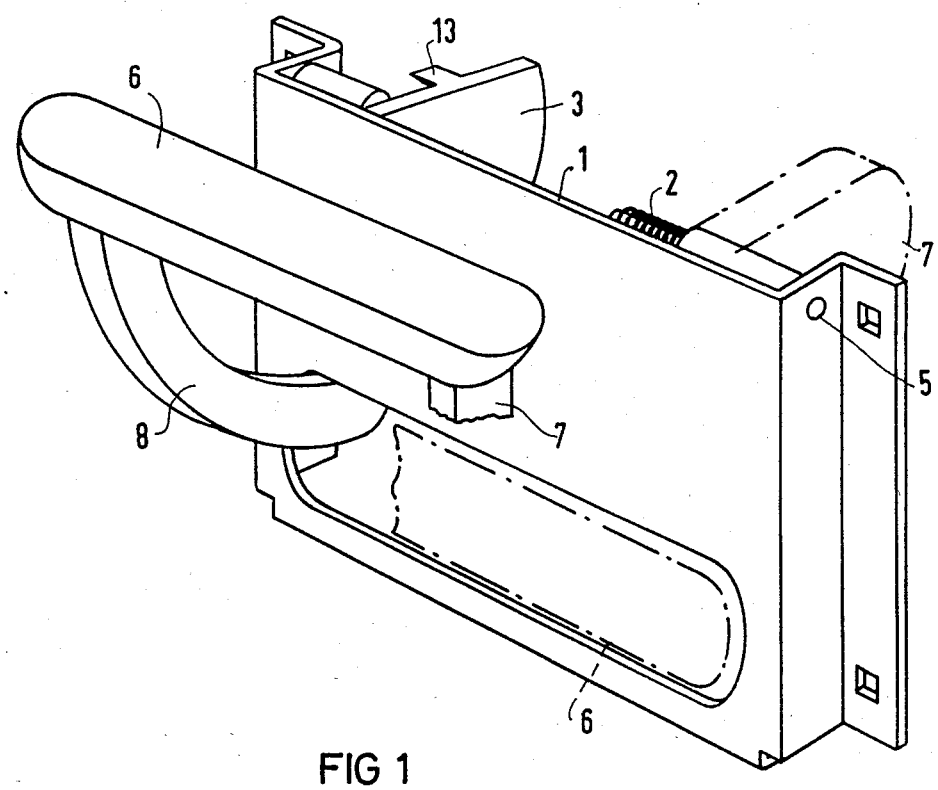
FIG. 1 is a diagrammatic, oblique front view of an electrical equipment enclosure incorporating the novel carrying handle device.

Referring to FIG. 1, an enclosure for housing electrical equipment or apparatus is shown which has a wall formed from a metal plate 1 which is double-bent at its edges which offsets the central portion of the plate from the end portions of the plate. The lower part of the plate has an opening in which lies a carrying handle 6 when in the rest position of the carrying device (shown in phantom). In the rest position the outer surface of the carrying handle 6 is flush with the metal plate 1. Fixed to the handle are two carrying arms 7,8 only one of which is shown for reasons of clarity for the rest position.

Figure 2:
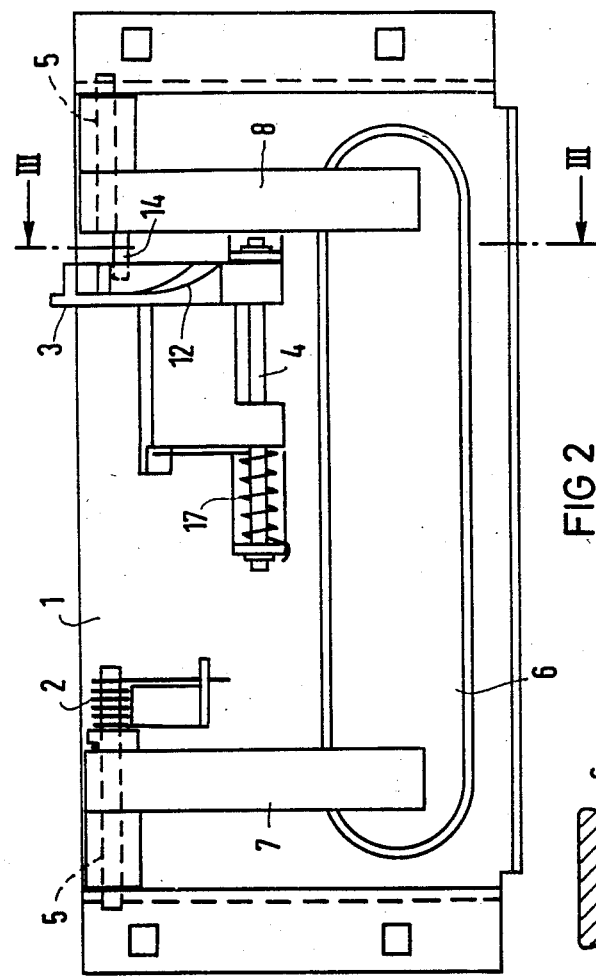
FIG. 2 is a rear view of the carrying handle device.

Referring to FIGS. 1 and 2, the carrying arms 7,8 and the carrying handle 6 are preferably made in one part. The carrying arms each having a generally straight portion approximately equal in length to the preselected distance of the axle from the wall opening and having an arcuate section approximately one-quarter of a circle in length with the handle being attached thereto. Carrying arm 7 is pivoted at bolt 5 which is fixed to the angular bend of metal plate 1. Carrying arm 7 is arranged in the same way at the left side of metal plate 1.

Simple handling is provided by a spring 2 and a guide plate 3 into which a pin 14 extends. The pin 14 is fastened to the carrying arm 8. The handling is done in a manner so that when in the rest position, the carrying handle is detained in a notch. By inwardly when in the rest position pushing the handle, the spring 2 will swing the handle into the operating position as shown in solid lines in FIG. 1. By pressing the carrying handle against the spring, the handle can be returned to the rest position.

Figure 4:
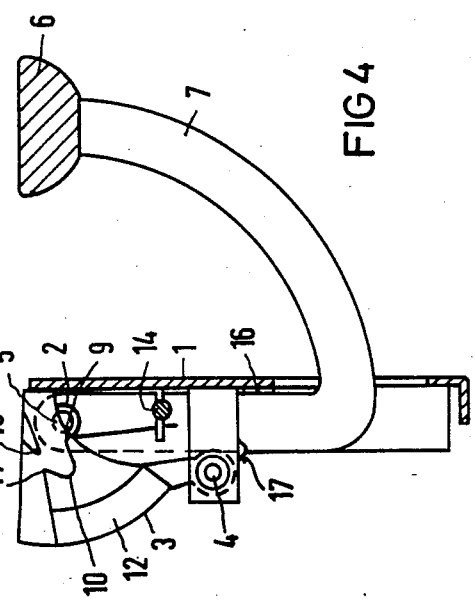
FIG. 4 is a sectional view similar to FIG. 3 but showing the carrying handle device in the working position.
Figure 3:
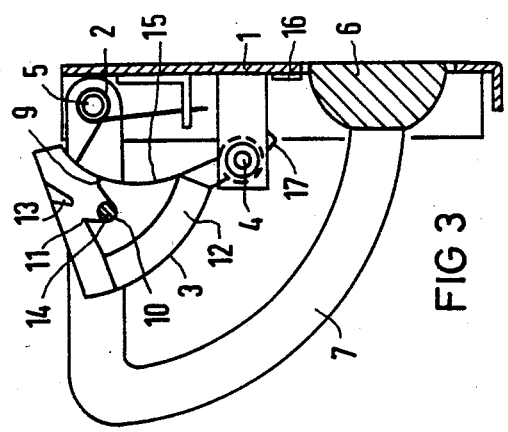
FIG. 3 is a sectional view taken along line III—III of FIG. 2 showing the carrying handle device in the stored position.

The back view in FIG. 2, as well as the sections in FIG. 3 and 4 show details of the swivelling mechanism. Again, the metal plate is 1; the spring which swings the carrying handle outside is 2; and the two carrying arms are 7 and 8. The carrying device is now in the working position. Into the carrying arm 8 a pin 14 is pressed whose axis is parallel to the swiveling axis of the carrying arms 7,8. The carrying arms pivot or swivel about the pins, axles or bolts 5. The pin reaches into the plane of the guide plate 3. In the working position of the carrying device shown, the pin 14 is outside of the guide plate 3 which is arranged to swivel or pivot around an axis 4 and is pressed forward by a spring 17 against the metal plate 1. The carrying arms 7,8 rest against a stop 16 through pressure from spring 2 and, additionally, by the force exerted when carrying the weight of the apparatus.

When pressing the handle into the rest position, the pin 14 travels in a circular motion around the swiveling axis of the carrying arms 7,8 (See FIG. 3). The pin now engages with the guide plate 3 so that after further pushing in of the handle, the pin slides along a sliding surface 15 of the guide plate and, doing so, swings the guide plate around axis 4 to the inside. If the handle is pushed in further inside, over the rest position, the pin 14 at the end of slide area 15 reaches a nose 9 and the guide plate is turned by the spring 17 slightly outwards, with the result that pin 14 moves into a fork-like recess 10 of the guide plate. The direction of the motion of pin 14 and the swing direction of the fork-like recess 10 are approximately perpendicular to each other, so that the carrying device, in this position, is arrested through the force of spring 2. An added projection piece 13 is arranged relative to nose 9 in such a way that pin 14 is securely brought into the fork-like recess 10 and the carrying device is safely engaged in the rest position. If carrying handle 6 is pushed inside from its rest position, the guide plate 3 is swung inside by pin 14 until pin 14 reaches another nose 11 where it releases the guide plate, so that by action of spring 17 the guide plate 3 is swung back into the position as shown in FIG. 3. When releasing the carrying handle, it will be swiveled outside through the force of spring 2. At this time pin 14 with its point slides over a slanted surface 12, so that guide plate 3 is moved in an axial direction against spring 17. If the pin 14 now travels over and out of the slanted surface into the position shown in FIG. 3, the guide plate is again released and will be pressed by action of spring 17 back into the position shown in FIG. 2, in which the point of the pin 14 lies again in the plane area of the guide plate. Now the carrying device is back in its working position.

Thus, there is provided a carrying device for electrical apparatus or equipment which is convenient to use and stores out of way. The carrying device is not only easy to use and has tremendous strength and hardiness, but also has a pleasing, if not graceful, appearance.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed is new and desired to be secured by Letters Patent of the United States is:

1. A carrying device for an electrical apparatus enclosure having a wall with an opening therein, comprising:
   elongate carrying arms bent in a semi-circular shape protruding through the opening in the wall of the enclosure and movably suspended behind the wall;
   a carrying handle mounted on the arms and movable between rest and working positions, in the rest position the handle lying flush to the outside in the wall opening and in the working position is swung up, out of the housing, said carrying arms swivel around a fixed axle and have a straight part, the length of which is approximately equal to the distance of axle to the opening in the enclosure, and an arc-shaped section having the length of approximately 1/4 of a circle and having the handle attached to it;
   a spring arranged on a swivelling axis which swings the carrying handle into the working position; said carrying arm is fixed on a pin which is parallel to the swivelling axis, the pin engaging a swivelling guide plate, the axis of which is arranged parallel to the swivelling axis of the carrying arm, in the working position of the carrying handle the pin and guide plate are not meshed and the guide plate is pressed against a stop plate by a spring, when the swivelling arms move from the working position of the carrying handle into the rest position the pin lies against the sliding surface of the guide plate and swivels the guide plate back against the pressure of the spring, the end of the sliding surface forming a first nose over which the pin slips after reaching the rest position, releasing the guide plate which is pushed by the spring and swivels against a stop until the pin settles in a fork-like recession of the guide plate.

2. A carrying device in accordance with claim 1, wherein swivelling the carrying arms beyond the rest position presses the carrying handle behind the wall of the housing sliding the pin over a second nose of the guide plate releasing the guide plate which is then swivelled back by the spring against the stop releasing the pin and the carrying arms for swinging into the rest position.

3. A carrying device in accordance with claim 1, wherein swivelling the carrying arms into the rest position slides the point of the pin on a slanted surface of the guide plate so that the pin and respectively the guide plate are moved axially out of the plane of the guide plate and wherein before reaching the working position the pin slides over the slanted surface and after travelling over the highest point jumps back in an axial direction into the plane of the guide plate.

4. A carrying device in accordance with claim 1, wherein the guide plate is perpendicularly movable relative to its plane and the spring presses in the direction of the pin.

5. A carrying device for an electrical equipment enclosure, comprising:
   an enclosure wall having a central portion with an opening therein and first and second end portions angularly extending from the central portion;
   elongate carrying arms having a curvilinear configuration and protruding through the opening in the enclosure wall;
   a carrying handle mounted on the elongate carrying arms; and
   means for mounting the carrying arms behind the plate for movement of the handle from a rest position at which the handle it positioned within the wall opening at least flush with the wall and a work position at which the handle is spaced from the wall a preselected distance, said mounting means including:
   a guide plate having a notch therein;
   a pin fastened to one of the carrying arms and extending into the guide plate and engaging the notch at the rest position of the handle and holding the handle in the rest position; and
   a spring associated with one of the carrying arms for urging the handle toward the work position upon disengagement of the pin and notch.

6. a carrying device, as set forth in claim 5, wherein the pin disengages the notch in response to moving the handle toward the opening in the enclosure wall.

7. A carrying device, as set forthin claim 5, including:
   a bracket attached to the wall; and
   a pivot pin fixedly attached to the bracket, said spring encoiled about the pviot pin, the guide plate being pivotally mounted on the pin, said spring exerting a rotational force on the guide plate urging engagement of the pin and notch at the rest position of the handle.

8. A carrying device, as set forth in claim 5, wherein the means for mounting the carrying arms includes:
   an axle associated with each carrying arm and fixed to the enclosure wall a preselected distance from the enclosure wall opening; and
   said carrying arms each having a generally straight portion approximately equal in length to the preselected distance of the axle from the wall opening and having an arcuate section approximately one-quarter of a circle in length with the handle attached thereto.

9. A carrying device, as set forth in claim 8, wherein said spring is encoiled about the axle.

10. A carrying device for an electrical equipment enclosure, comprising:
    an enclosure wall having a central portion with an opening therein and first and second end portions;

elongate carrying arms having a curvilinear configuration;

a carrying handle mounted on the carrying arms and movable with the arms between a rest position and a work position;

an axle associated with each carrying arm and fixed to the enclosure wall;

a spring encoiled about the axle for biasing the arms;

a pin attached to a selected one of the carrying arms and being positioned substantially parallel to the axle;

a guide plate having a notch therein of a size and configuration sufficient for receiving the pin attached to the selected one of the carrying arms;

a bracket attached to the enclosure wall;

a pivot pin fixedly connected to the bracket and pivotally connected to the guide plate; and a spring encoiled about the pivot pin for biasing the guide plate said guide plate moves perpendicularly relative to its plane and the spring presses in the direction of the pin.

11. A carrying device for an electrical equipment enclosure, comprising:

an enclosure wall having a central portion with an opening therein and first and second end portions;

elongate carrying arms having a curvilinear configuration;

a carrying handle mounted on the carrying arms and movable with the arms between a rest position and a work position;

an axle associated with each carrying arm and fixed to the enclosure wall;

a spring encoiled about the axle for biasing the arms;

a pin attached to a selected one of the carrying arms and being positioned substantially parallel to the axle;

a guide plate having a notch therein of a size and configuration sufficient for receiving the pin attached to the selected one of the carrying arms;

a bracket attached to the enclosure wall;

a pivot pin fixedly connected to the bracket and pivotally connected to the guide plate; and a spring encoiled about the pivot pin for biasing the guide plate, the pin and the guide plate are free of meshing contact in the working position of the handle and the guide plate is urged toward the enclosure wall by the spring coiled about the pivot pin, the pin lying against a sliding surface of the guide plate and moving the guide plate against the force of the spring during movement of the handle from the working position to the rest position.

12. A carrying device, as set forth in claim 11, wherein the sliding surface of the guide plate has a nose-like configuration over which the pin slides after reaching the rest position releasing the guide plate which pivots under the force of the spring until the pin engages a recession in the guide plate, the direction of rotation of the guide plate relative to the pin during this motion ensuring that the handle in the rest position is locked.

13. A carrying device, as set forth in claim 12, wherein moving the carrying arms beyond the rest position whereby the handle is pressed behind the enclosure wall causing the pin to slide over a second nose of the guide plate releasing the guide plate which pivots under the force of the spring until a stop member is encountered releasing the pin and the carrying arms for movement into the rest position;

moving the carrying arms into the rest position causes the point of the pin to slide on a slanted surface of the guide plate so that the pin and the guide plate move in an axial direction out of the plane of the guide plate.

* * * * *